(12) United States Patent  (10) Patent No.: US 10,599,173 B2
Du et al.                  (45) Date of Patent:     Mar. 24, 2020

(54) VOLTAGE REGULATOR AND POWER SUPPLY

(71) Applicant: SHENZHEN GOODIX TECHNOLOGY CO., LTD., Shenzhen (CN)

(72) Inventors: Wei Du, Shenzhen (CN); Junjun Zhang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/387,533

(22) Filed: Apr. 18, 2019

(65) Prior Publication Data

US 2019/0243402 A1   Aug. 8, 2019

Related U.S. Application Data

(63) Continuation of application No. PCT/CN2017/113306, filed on Nov. 28, 2017.

(51) Int. Cl.
*G05F 1/575* (2006.01)
*H03F 3/45* (2006.01)
*G05F 1/46* (2006.01)

(52) U.S. Cl.
CPC .............. *G05F 1/575* (2013.01); *G05F 1/468* (2013.01); *H03F 3/45183* (2013.01); *H03F 3/45269* (2013.01); *H03F 3/45273* (2013.01); *H03F 3/45475* (2013.01); *H03F 3/45991* (2013.01);

(Continued)

(58) Field of Classification Search
CPC ... G05F 1/46; G05F 1/461; G05F 1/56; G05F 1/575; H03F 3/45269; H03F 3/45273
See application file for complete search history.

(56) References Cited

U.S. PATENT DOCUMENTS 6,054,887 A * 4/2000 Horie .................. H03F 1/304
                                              327/307
9,366,566 B2 * 6/2016 Frank ...................... G01J 1/18
(Continued)

FOREIGN PATENT DOCUMENTS

CN    101308391 A    11/2008
CN    102915060 A     2/2013
(Continued)

*Primary Examiner* — Adolf D Berhane

(57) ABSTRACT

A voltage regulator and a power supply are provided. The voltage regulator includes an operational amplifier and an offset voltage control module. The operational amplifier includes an input terminal and an output terminal, and is configured to generate an output voltage to be output from the output terminal based on a reference voltage received from the input terminal. The offset voltage control module includes one stage of regulation branch or more stages of regulation branches connected in parallel, and is configured to control an offset voltage of the operational amplifier based on selection of the regulation branch to regulate the output voltage. Since sine each stage of regulation branch in the offset voltage control module is based on a transistor structure, as compared with the voltage dividing resistor in the related art, the transistor has lower power consumption, and thus power consumption of the voltage regulator is lowered.

17 Claims, 7 Drawing Sheets

(52) U.S. Cl.
CPC .............. *H03F 2203/45044* (2013.01); *H03F 2203/45101* (2013.01)

(56) References Cited

U.S. PATENT DOCUMENTS

| | | | |
|---|---|---|---|
| 2007/0024263 A1* | 2/2007 | Yang | G05F 1/575 |
| | | | 323/315 |
| 2008/0290943 A1 | 11/2008 | Schelmbauer | |
| 2011/0121809 A1 | 5/2011 | Camacho Galeano et al. | |
| 2011/0285363 A1 | 11/2011 | Mai et al. | |
| 2013/0342273 A1* | 12/2013 | Petrie | H03F 3/45 |
| | | | 330/253 |
| 2014/0077780 A1 | 3/2014 | Teong et al. | |
| 2014/0139285 A1* | 5/2014 | Maderbacher | H03F 3/387 |
| | | | 330/9 |

FOREIGN PATENT DOCUMENTS

| | | |
|---|---|---|
| CN | 103383583 A | 11/2013 |
| CN | 103412610 A | 11/2013 |
| CN | 103605397 A | 2/2014 |
| CN | 103823500 A | 5/2014 |
| CN | 103853222 A | 6/2014 |
| CN | 106383539 A | 2/2017 |
| CN | 107015595 A | 8/2017 |
| WO | 2017003615 A1 | 1/2017 |

\* cited by examiner

VOLTAGE REGULATOR AND POWER SUPPLY

CROSS-REFERENCE TO RELATED APPLICATIONS

The present application is a continuation of international application No. PCT/CN2017/113306, filed on Nov. 28, 2017, which is hereby incorporated by reference in its entirety.

TECHNICAL FIELD

Embodiments of the present disclosure relate to the technical field of power supply, and in particular, relate to a voltage regulator and a power supply.

BACKGROUND

A voltage regulator is generally used in an electronic system to ensure that power supply supplies power stably in the electronic system and an output voltage of the power supply may be regulated. FIG. 1 illustrates a basic structure of a conventional voltage regulator. In FIG. 1, the voltage regulator includes an operational amplifier, a regulation transistor, a voltage dividing resistor R1 and a voltage dividing resistor R2. $V_{IN}$ is an input voltage of the voltage regulator, $V_{OUT}$ is an output voltage of the voltage regulator, and $V_{REF}$ is a reference voltage generated by a bandgap reference generation circuit. An operating process of the voltage regulator may be briefly summarized as follows: a reference voltage $V_{REF}$ is input to an inverting input terminal of the operational amplifier, and an output voltage $V_{OUT}$ subjected to sampling by the voltage dividing resistors R1 and R2 is input to a non-inverting input terminal, and the output voltage $V_{OUT}$ of the operational amplifier is connected to the regulation transistor (that is, the pass transistor in FIG. 1). The regulation transistor is configured to stabilize the output voltage $V_{OUT}$ to achieve stable power supply. In addition, the output voltage $V_{OUT}$ is then regulated by regulating a ratio of the voltage dividing resistor R1 to the voltage dividing resistor R2.

When the electronic system is in a standby state, the voltage regulator still needs to supply the output voltage $V_{OUT}$ to ensure normal operation of a part of modules in the electronic system. However, when the electronic system is in the standby state, a load current output by the voltage regulator is small, whereas the voltage regulator may have high power consumption due to presence of the voltage dividing resistors R1 and R2.

SUMMARY

Embodiments of the present disclosure are intended to provide a voltage regulator and a power supply, to at least solve the above technical problem in the related art.

To achieve the above objectives, embodiments of the present disclosure provide a voltage regulator. The voltage regulator includes: an operational amplifier and an offset voltage control module.

The operational amplifier includes an input terminal and an output terminal, and the operational amplifier is configured to generate an output voltage to be output from the output terminal based on a reference voltage received from the input terminal.

The offset voltage control module includes one stage of regulation branch or more stages of regulation branches connected in parallel, and the offset voltage control module is configured to control an offset voltage of the operational amplifier based on selection of the regulation branch to regulate the output voltage.

To achieve the above objectives, embodiments of the present disclosure further provide a power supply. The power supply includes the above described voltage regulator.

Embodiments of the present disclosure provide a voltage regulator and a power supply. The voltage regulator includes an operational amplifier and an offset voltage control module. The operational amplifier includes an input terminal and an output terminal, and is configured to generate an output voltage to be output from the output terminal based on a reference voltage received from the input terminal. The offset voltage control module includes one stage of regulation branch or more stages of regulation branches connected in parallel, and is configured to control an offset voltage of the operational amplifier based on selection of the regulation branch to regulate the output voltage. Since each stage of regulation branch in the offset voltage control module is based on a transistor structure, as compared with the voltage dividing resistor in the related art, the transistor has lower power consumption, and thus power consumption of the voltage regulator is lowered.

BRIEF DESCRIPTION OF THE DRAWINGS

For clearer description of the technical solutions in embodiments of the present disclosure or in the related art, hereinafter, drawings that are to be referred for description of the embodiments or the related art are briefly described. Apparently, the drawings described hereinafter merely illustrate some embodiments of the present disclosure. Persons of ordinary skill in the art may also derive other drawings based on the drawings described herein without any creative effort.

DETAILED DESCRIPTION

Practice of the present disclosure is described in detail with reference to drawings and specific embodiments, such that the practice of addressing the technical problem using the technical means according to the present disclosure and achieving the technical effects may be better understood and conducted.

Figure 2:
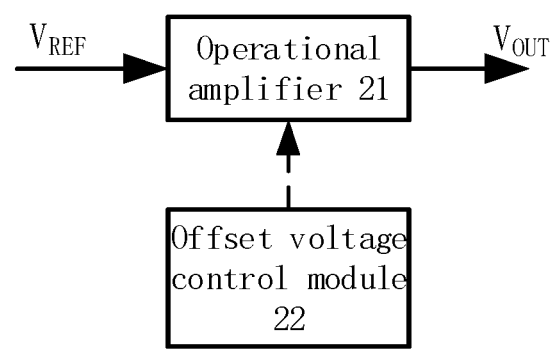
FIG. 2 is a schematic structural diagram of a voltage regulator according to an embodiment of the present disclosure.

FIG. 2 is a schematic structural diagram of a voltage regulator according to an embodiment of the present disclosure. In this embodiment, FIG. 2 illustrates a structural principle of the voltage regulator. Exemplary structures of various units in the voltage regulator may be referenced to disclosure in the embodiments hereinafter.

As illustrated in FIG. 2, the voltage regulator includes an operational amplifier 21 and an offset voltage control module 22.

The operational amplifier 21 includes an input terminal and an output terminal, and the operational amplifier is configured to generate an output voltage $V_{OUT}$ to be output from the output terminal based on a reference voltage $V_{REF}$ received from the input terminal.

In this embodiment, when an input voltage at the input terminal is 0 V, the output voltage $V_{OUT}$ is $-V_{OS}$. $V_{OS}$ is an offset voltage $V_{OS}$ of the operational amplifier. In an ideal state, when the input voltage at the input terminal of the operational amplifier is 0 V, the output voltage $V_{OUT}$ is also 0 V. That is, the offset voltage $V_{OS}$ is 0 V. However, in practical disclosure, the input voltage of the operational amplifier does not match the output voltage thereof. That is, when the input voltage at the input terminal is 0 V, the output voltage $V_{OUT}$ is not 0 V. That is, the offset voltage $V_{OS}$ is not 0 V.

Figure 3:
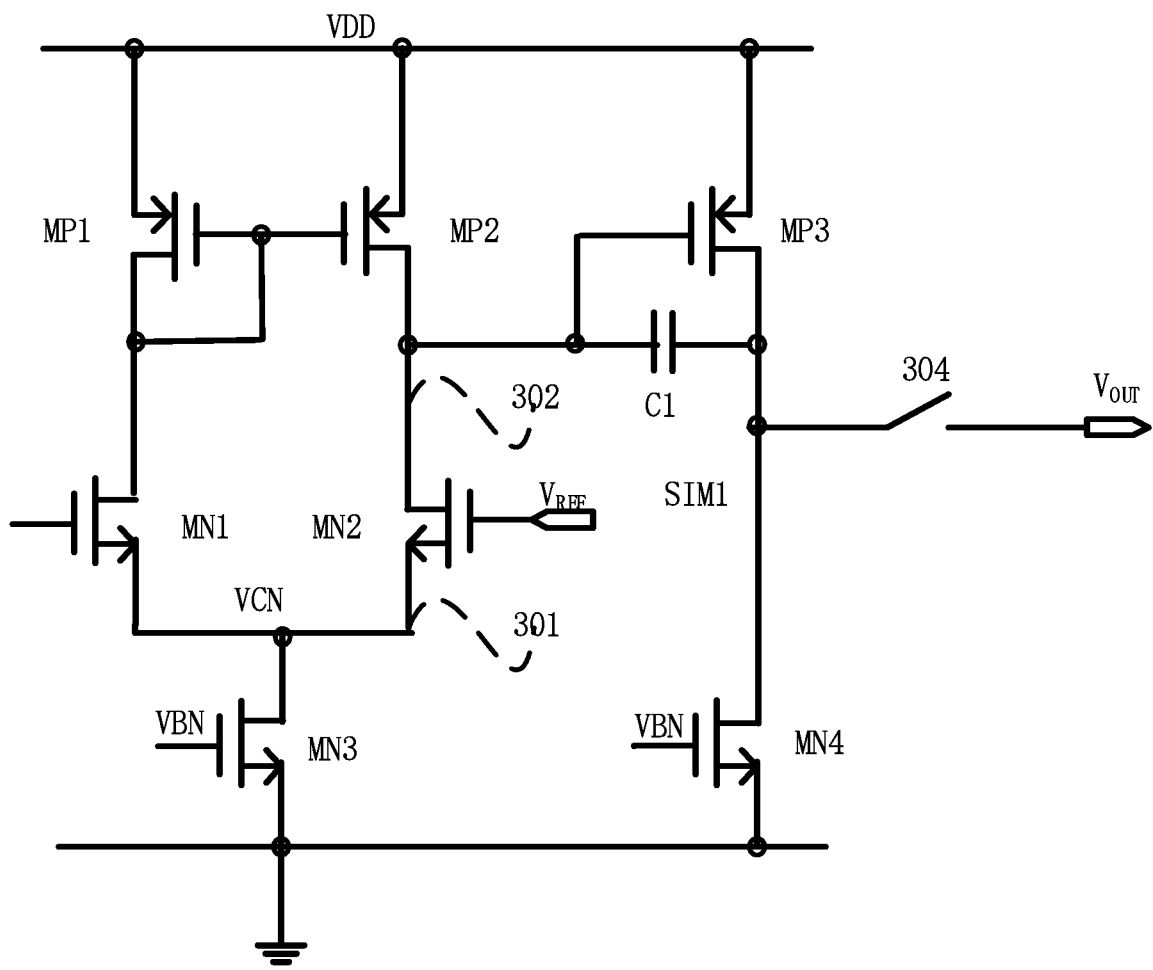
FIG. 3 is a schematic structural diagram of an operational amplifier according to an embodiment of the present disclosure.
Figure 4:
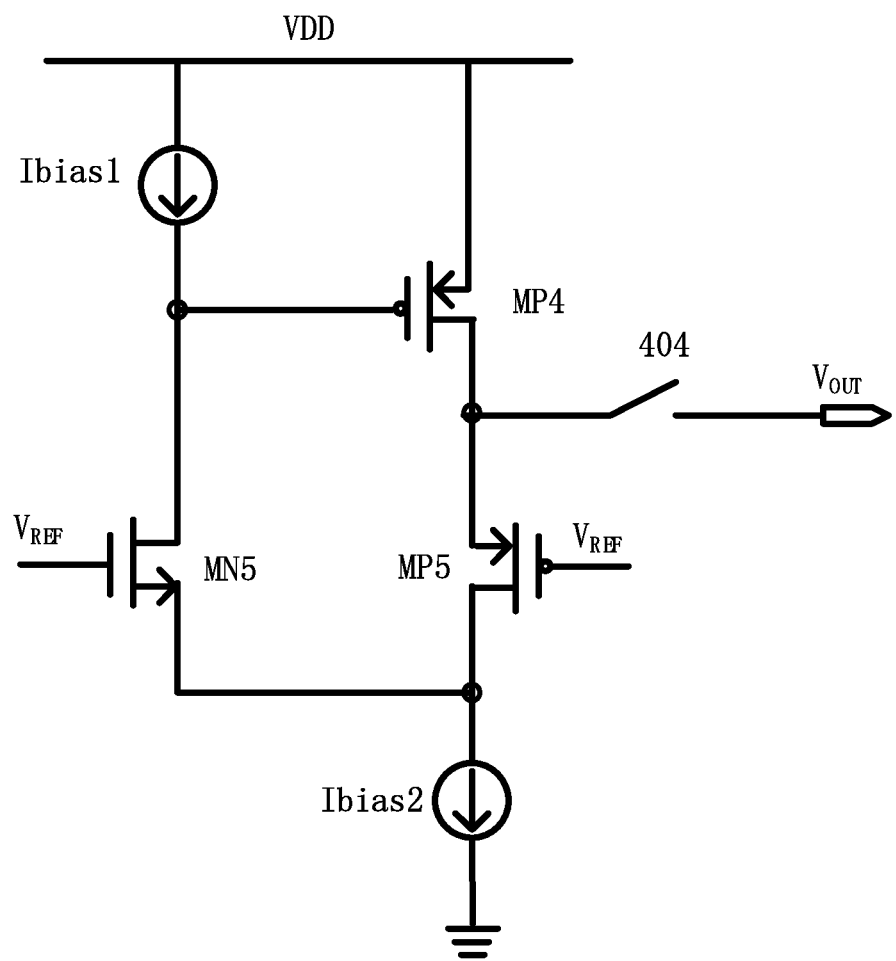
FIG. 4 is a schematic structural diagram of another operational amplifier according to an embodiment of the present disclosure.

In this embodiment, an exemplary structure of the operational amplifier may be referenced to FIG. 3 or FIG. 4.

The offset voltage control module 22 includes one stage of regulation branch or more stages of regulation branches connected in parallel, and the offset voltage control module 22 is configured to control an offset voltage $V_{OS}$ of the operational amplifier based on selection of the regulation branch to regulate the output voltage $V_{OUT}$.

In the related art, the offset voltage $V_{OS}$ may be equivalent to a voltage source loaded at the input terminal of the operational amplifier. Therefore, by regulating the offset voltage $V_{OS}$, it may be ensured that the output voltage $V_{OUT}$ is also 0 V when the input voltage of the operational amplifier is 0 V. It is thus apparent that the output voltage of the operational amplifier is affected by the offset voltage. Therefore, in this embodiment, the output voltage $V_{OUT}$ of the operational amplifier may be controlled by controlling the offset voltage $V_{OS}$.

In this embodiment, by using the one stage of regulation branch or more stages of regulation branches connected in parallel, the offset voltage $V_{OS}$ is regulated under cooperation actions of the transistors in the regulation branches.

Each regulation branch may specifically include a plurality of transistors. The types of the transistors and connections between the transistors may be determined based on the circuit structure of the operational amplifier and the device that is connected to the offset voltage control module in the operational amplifier. Different regulation branches may have different circuit structures.

For example, when two values, A V or B V, of the output voltage $V_{OUT}$ are needed, the offset voltage is also only C V or D V; when $V_{OS}$=C V, the output voltage $V_{OUT}$ is A V; and when $V_{OS}$=D V, the output voltage $V_{OUT}$ is B V. In this case, the above demand may be satisfied only by using one stage of regulation branch, and the offset voltage control module 22 may only include one stage of transistor-based regulation branch.

However, when more than two values of the output voltage $V_{OUT}$ are needed, more stages of regulation branches connected in parallel are desired for cooperation. In this case, the offset voltage control module 22 includes more stages of transistor-based regulation branches connected in parallel.

In addition, in this embodiment, more stages of regulation branches are connected in parallel because when the more stages of regulation branches are connected in parallel, the regulation branches may be randomly selected for use, and changes of one regulation branch may not affect the other regulation branches. In this way, equivalent transistors having different parameters may thus be formed, such that the offset voltage $V_{OS}$ may be regulated.

In this embodiment, an exemplary structural diagram of the offset voltage control module may be referenced to FIG. 5 hereinafter.

In this embodiment, since each stage of regulation branch in the offset voltage control module is based on a transistor structure, as compared with the voltage dividing resistor in the related art, the transistor has lower power consumption, and thus power consumption of the voltage regulator is lowered.

In addition, use of the voltage dividing resistor in the related art results in a large occupied area. However, with respect to the transistor-based regulation branch in this embodiment, since the transistor occupies only a small area, disclosure of the transistor reduces the area desired by the voltage regulator.

FIG. 3 is a schematic structural diagram of an operational amplifier according to an embodiment of the present disclosure. In this embodiment, the operational amplifier may be specifically a buffer (BUF) amplifier. As illustrated in FIG. 3, the buffer amplifier includes: PMOS transistors MP1, MP2 and MP3, NMOS transistors MN1, MN2, MN3 and MN4, and a capacitor C1.

MP1 and MP2 share a common gate and a common drain, the sources of MP1 and MP2 are electrically connected, and the drain is connected to a drive voltage VDD, a source of MP1 is connected to the gate thereof, such that a current mirror structure is formed.

MN1 and MN2 are differential input pair transistors of the buffer amplifier, a drain of MN1 is connected to a source of MP1, a drain of MN2 is connected to a source of MP2, a source of MN1 and a source of MN2 are both connected to a drain of MN3, a gate of MN3 is connected to a bias voltage VBN such that MN3 operates, and a source of MN3 is connected to the ground.

A gate of MN1 and a gate of MN2 are respectively used as an inverting input terminal and a non-inverting input terminal of the buffer amplifier, and the drain of MN2 is used as an output terminal of a differential unit.

The above MP1, MP2, MN1, MN2 and MN3, and the specific connections therebetween form a double input single output differential unit loaded on a PMOS current mirror.

The drain of MN2 is connected to the capacitor C1 and a gate of MP3 respectively, a drain of MP3 is connected to the drive voltage VDD, a source of MP3 is connected to the other terminal of the capacitor C1 and connected to the drain of MN3, and is used as an output terminal of the buffer amplifier, a source of MN4 is connected to the ground, and a gate of MN4 is connected to the bias voltage VBN such that MN4 is conducted.

The above C1, MP3 and MN4, and the specific connections therebetween form an output unit of the buffer amplifier.

In this embodiment, the reference voltage $V_{REF}$ is input to the non-inverting input terminal of the buffer amplifier, that is, the gate of MN2 is used as the non-inverting input terminal and the reference voltage $V_{REF}$ is input thereto; the inverting input terminal is connected to the output terminal to form a negative feedback, that is, the gate of MN1 is used as the inverting input terminal and is connected to the drain of MN2 used as the output terminal of the differential unit to form a negative feedback, to stabilize the output voltage $V_{OUT}$ of the buffer amplifier.

When the buffer amplifier is operating, the voltages at the inverting input terminal and the non-inverting input terminal are both greater than a threshold voltage $V_{TH}$, such that MN1 and MN2 are conducted, and the buffer amplifier normally operates. In this case, the output voltage $V_{OUT}$ of the buffer amplifier is:

$$V_{OUT}=V_{REF}-V_{OS} \quad (1)$$

$$V_{OS}=V_{GSMN1}-V_{GSMN2} \quad (2)$$

$V_{OUT}$ is the output voltage of the buffer amplifier, $V_{OS}$ is the offset voltage of the buffer amplifier, $V_{REF}$ is the input reference voltage, $V_{GSMN1}$ is the voltage between the source S of MN1 and the gate G of MN1, and $V_{GSMN2}$ is the voltage between the source S of MN2 and the gate G of MN2.

In practice, the differential input pair transistors of the buffer amplifier do not match, such that $V_{GSMN1}$ and $V_{GSMN2}$ are not equal; and when the input voltage is 0 V, the output voltage is not 0 V. As a result, the offset voltage $V_{OS}$ is not 0 V.

FIG. 4 is a schematic structural diagram of another operational amplifier according to an embodiment of the present disclosure. As illustrated in FIG. 4, different from the above embodiment, in this embodiment, the operational amplifier is specifically a flipped voltage follower (FVF). The FVF includes: PMOS transistors MP4 and MP5, an NMOS transistor MN5, and bias current sources Ibias1 and Ibias2.

A drain of MP4 is connected to the drive voltage VDD, a source of MP4 is connected to a drain of MP5, a gate of MP4 is connected to a drain of MN5, a drain of MN5 is connected to the drive voltage VDD via the bias current source Ibias1, and a source of MN5 is connected to a source of MP5 and connected to the ground via the bias current source Ibias2. MN5 and MP5 are the differential input pair transistors of the operational amplifier, gates of MN5 and MP5 are respectively used as the inverting input terminal and the non-inverting input terminal of the operational amplifier, and the drain of MP5 is used as the output terminal of the operational amplifier.

The above MP4, MP5, MN5, Ibias1 and Ibias2, and the specific connections therebetween form the FVF.

In this embodiment, the non-inverting input terminal and the inverting input terminal of the operational amplifier are both connected to the reference voltage $V_{REF}$, the output terminal of the operational amplifier is connected to MN5 via a source and a drain of MP4 to form a negative feedback to stabilize the output voltage $V_{OUT}$.

When the operational amplifier is operating, the reference voltage $V_{REF}$ is simultaneously input to the inverting input terminal and the non-inverting input terminal, and $V_{REF}$ is greater than the threshold voltage $V_{TH}$ of MN5 and MP5, such that MN5 and MP5 are conducted and the operational amplifier normally operates. In this case, the output voltage $V_{OUT}$ of the operational amplifier is:

$$V_{OUT}=V_{REF}-V_{GSMP5} \quad (3)$$

$V_{GSMP5}$ is the offset voltage $V_{OS}$ of the FVF.

Optionally, based on the above operational amplifier, the voltage regulator may include a control switch, configured to be connected to the output terminal of the operational amplifier and an electronic system, for example, a control switch as illustrated in FIG. 4, or a control switch 404 as illustrated in FIG. 4. The control switch is turned on when the electronic system is in a standby working mode, such that the output voltage of the operational amplifier supplies power for a part of modules in the standby electronic system to ensure normal operation of the electronic system.

It should be noted that FIG. 3 and FIG. 4 only describes the operational amplifier using the specific circuit structures. However, these circuit structures are not intended to limit the operational amplifier in the present disclosure, but other circuit structures may also be used. In practice, for persons of ordinary skill in the art, other types of operational amplifiers may also be employed, or operational amplifiers developed by optimizing and improving the structure as illustrated in FIG. 3 or FIG. 4 may be employed.

Figure 5:
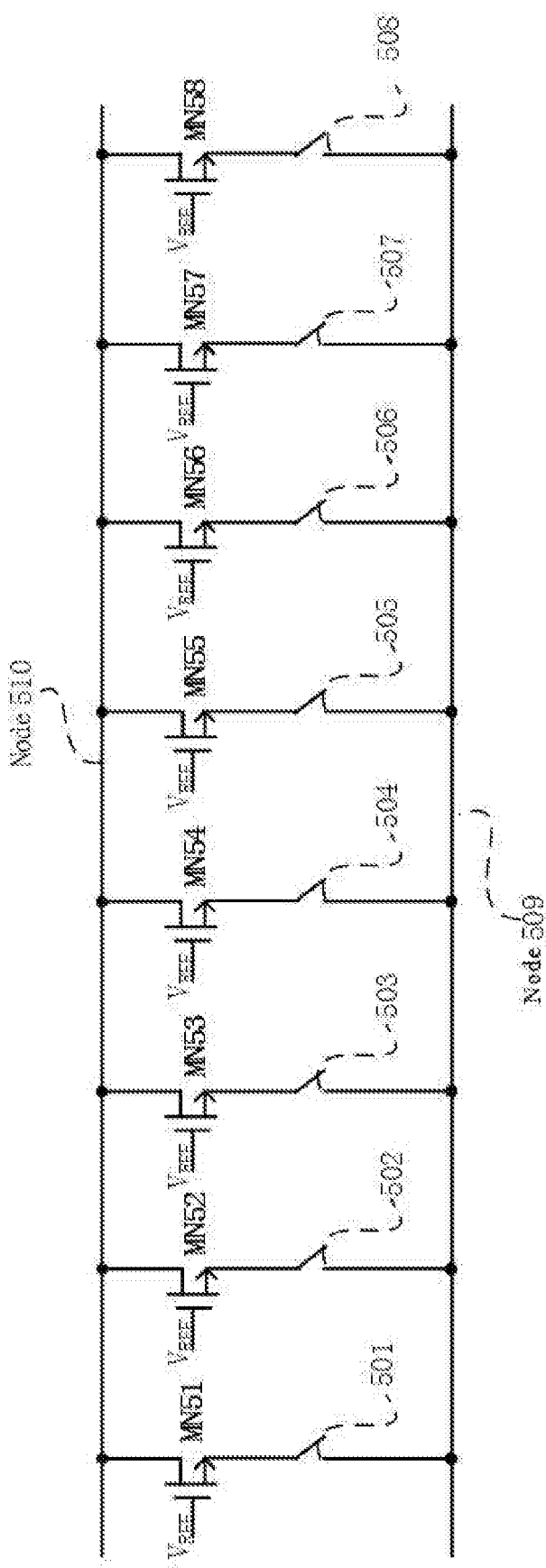
FIG. 5 is a schematic structural diagram of an offset voltage control module according to an embodiment of the present disclosure.

FIG. 5 is a schematic structural diagram of an offset voltage control module according to an embodiment of the present disclosure. In this embodiment, description is given using the offset voltage control module used in the buffer amplifier in FIG. 3 as an example. In this embodiment, as illustrated in FIG. 5, the offset voltage control module includes:

eight stages of regulation branches connected in parallel; where each stage of regulation branch includes a regulation element and a regulation switch. The regulation branch is connected to a device affecting the offset voltage $V_{OS}$ inside the operational amplifier (for example, the regulation branch may be connected to MN1 and MN2 in the operational amplifier in FIG. 3). Specifically, with respect to any stage of regulation branch, conduction of the regulation branch is controlled by controlling conduction of the regulation switch, such that the regulation element of the conducted regulation branch is connected to the operational amplifier to control the offset voltage $V_{OS}$ of the operational amplifier.

When the offset voltage control module is applied to FIG. 3, the buffer amplifier as illustrated in FIG. 3 includes differential input pair transistors MN1 and MN2. At least one of the differential input pair transistors MN1 and MN2 is connected in parallel to any one or more stages of regulation branches in the offset voltage control module, to control a voltage difference between the differential input pair transistors by the any one or more stages of regulation branches in the offset voltage control module, and hence to control the offset voltage $V_{OS}$ of the operational amplifier.

In this embodiment, description is given using a scenario where MN2 and any one or more stages of regulation branches in the offset voltage control module are connected in parallel as an example. Since MN2 is an NMOS transistor, the regulation element in the regulation branch in this embodiment is also an NMOS transistor, the regulation switches on the eight stages of regulation branches are respectively switches 501, 502, 503, 504, 505, 506, 507 and 508, and the regulation units are respectively units MN51, MN52, MN53, MN54, MN55, MN56, MN57 and MN58.

Referring to FIG. 5, the first stage of regulation branch to the eighth stage of regulation branch are illustrated from left to right. Using the first stage of regulation branch as an example, description is given to the structure of the regulation branch.

In the first stage of regulation branch, one terminal of the regulation switch 501 is connected to a source of the NMNS transistor MN501, and the other terminal thereof is connected to the source of MN2, that is, a node 509 in FIG. 5 is connected to a node 301 in FIG. 3; a gate of the NMOS transistor MN51, like the gate of MN2, is also connected to the reference voltage $V_{REF}$, and a drain of the NMOS transistor MN51 is connected to the drain of MN2, that is, a node 510 in FIG. 5 is connected to a node 302 in FIG. 3; when the regulation switch 501 is turned on, the NMOS transistor MN51 shares a common source, gate and drain with MN2, such that MN2 and the NMOS transistor MN51 are connected in parallel to be equivalent to a new NMOS transistor MN2'.

According to the features of the MOS transistor, the equivalent MN2' has an increased or decreased width-to-length ratio relative to MN2. For example, MN2 and the NMOS transistor MN51 both have a width of W1, a length of L1 and a width-to-length ratio of W1/L1, and in this case, the NMOS transistor MN51, sharing the common source, gate and drain with MN2, is equivalent to MN2', MN2' has a width of 2W1, a length of L1 and a width-to-length ratio of 2W1/L1, the width-to-length ratio of the equivalent MN2' is twice the width-to-length ratio of MN2; or MN2 has a width of W1, a length of L1 and a width-to-length ratio of W1/L1, the NMOS transistor MN51 has a width of W1, a length of ½L1 and a width-to-length ratio of W1/½L1, and in this case, the NMOS transistor MN51, sharing the common source, gate and drain with MN2, is equivalent to MN2', MN2' has a width-to-length ratio of W1/2L1, and the width-to-length ratio of the equivalent MN2' is ½ of the width-to-length ratio of MN2.

The NMOS transistor further has the following basic features:

$$V_{GS} = V_{TH} + \sqrt{\frac{2*I_D}{\mu C(W/L)}} \quad (4)$$

$V_{GS}$ is the voltage between the gate G and the source S of the NMOS transistor, $I_D$ is the current of the drain D of the NMOS transistor, $V_{TH}$ is the starting voltage of the NMOS transistor, μ is the impurity concentration of the NMOS transistor, C is the capacitance of an oxidation layer of the NMOS transistor, W is the channel width of the NMOS transistor, L is the channel length of the NMOS transistor, and W/L is the width-to-length ratio of the NMOS transistor.

As seen from formula (4), when $I_D$ of the NMOS transistor does not change but W/L changes, $V_{GS}$ may change with the change of W/L. In this case, in this embodiment, the width-to-length ratio of the NMOS transistor connected in parallel to MN2 may be controlled by controlling conduction and non-conduction of the regulation switch, such that the width-to-length ratio of the equivalent MN2' is controlled, and thus $V_{GS}$ of the equivalent MN2' is controlled. As known from the buffer amplifier in FIG. 2, and formula (1) and formula (2), when $V_{GS}$ (that is, $V_{GMSN2}$ in the formulae) of MN2' changes, the offset voltage $V_{GS}$ may correspondingly change, such that the output voltage $V_{OUT}$ of the operational amplifier change likewise. Specifically, in formula (1) and formula (2), when $V_{GSMN2}$ increases, the offset voltage $V_{OS}$ decreases and the output voltage $V_{OUT}$ increases; and on the contrary, the output voltage $V_{OUT}$ decreases.

Preferably, in this embodiment, when the offset voltage control module includes more stages of regulation branches, the width-to-length ratios of the MOS transistors in different regulation branches may be defined based on a predefined rule, to control a variation trend of the offset voltage $V_{OS}$. For example, in the eight regulation branches, the width-to-length ratios of the MOS transistors in the regulation branches ascend from left to right, in regulation of the offset voltage, the regulation switches are controlled to be turned on sequentially from left to right, the width-to-length ratio of the NMOS transistor connected in parallel to MN2 increases, and as a result, the change of the width is greater than the change of the length upon the equivalent effect such that the width-to-length ratio of the equivalent MN2' increases, and thus the offset voltage $V_{OS}$ increases progressively; and on the contrary, the regulation switches are controlled to be turned on sequentially from right to left, the width-to-length ratio of the NMOS transistor connected in parallel to MN2 decreases, and as a result, the change of the width is smaller than the change of the length upon the equivalent effect, such that the width-to-length ratio of the equivalent MN2' decreases, and thus the offset voltage $V_{OS}$ decreases progressively.

Specifically, the width-to-length ratios of the MOS transistors in different regulation branches are defined to increase progressively based on a predefined step, to control the offset voltage $V_{OS}$ to change linearly. For example, in the eight regulation branches, from left to right, the width-to-length ratios of the MOS transistors in the regulation branches are defined to increase progressively based on the predefined step, in regulation of the offset voltage $V_{OS}$, the regulation switches are initially turned off and turned on where the offset voltage $V_{OS}$ needs to be regulated, the regulation switches are turned on sequentially from left to right, and only one regulation switch is turned on each time, such that the width-to-length ratio of the equivalent MN2' increases likewise based on a specific step by the MOS transistors whose width-to-length ratios are defined to increase progressively based on the predefined step in the regulation branches. In this way, $V_{GS}$ of the equivalent MN2' decreases progressively and linearly. As seen from formula (1) and formula (2), when $V_{GS}$ (that is, $V_{GSMN2}$ in the formulae) of MN2' decreases progressively and linearly, the offset voltage VOS increases progressively and linearly. On the contrary, the regulation switches are initially turned off and turned on where the offset voltage $V_{OS}$ needs to be regulated, the regulation switches are turned on sequentially from right to left, and only one regulation switch is turned on each time, such that the width-to-length ratio of the equivalent MN2' increases likewise based on a specific step by the MOS transistors whose width-to-length ratios are defined to increase progressively based on the predefined step in the regulation branches. In this way, $V_{GS}$ of the equivalent MN2' increases progressively and linearly. As seen from formula (1) and formula (2), when $V_{GS}$ (that is, $V_{GSMN2}$ in the formulae) of MN2' increases progressively and linearly, the offset voltage $V_{OS}$ decreases progressively and linearly. Only one regulation switch is turned on each time. This may reduce the number of conducted regulation branches, such that the change of the offset voltage VOS is more controllable. Nevertheless, in other practice of this embodiment, more regulation switches may be simultaneously turned on.

When the regulation switches in all stages of regulation branches in the offset voltage control module are turned off, no regulation branch in the offset voltage control module is connected to the operational amplifier. In this case, the offset voltage control module is not connected to the operational amplifier any longer. Under this circumstance, if the buffer amplifier in FIG. 3 is an ideal amplifier, that is, MN1 well matches MN2, the offset voltage $V_{OS}$ is 0 V.

Nevertheless, settings of the width-to-length ratios of the MOS transistors in the regulation branches are only exemplarily described hereinabove, and the specific values may be determined based on other methods, for example, software simulation and the like.

In this embodiment, the values of the width-to-length ratios of the MOS transistors in the regulation branches may be further defined, such that a change range of the offset voltage $V_{OS}$ is (−M, M). When the regulation switches are all turned off, the offset voltage $V_{OS}$ is 0 V. In this case, the output voltage $V_{OUT}$ is equal to $V_{REF}$, such that a drive capability may be increased for the reference voltage $V_{REF}$ to obtain a voltage $V_{OUT}$ having the drive capability. When the eighth stage of regulation switch is turned off, the offset voltage $V_{OS}$ is M V. In this case, the output voltage $V_{OUT}$ is equal to $V_{REF}-V_{OS}=V_{REF}-M$, such that a buck output similar to buck-type DC-DC. When the first stage of regulation switch is turned off, the offset voltage $V_{OS}$ is −M V. In this case, the output voltage $V_{OUT}$ is equal to $V_{REF}-V_{OS}=V_{REF}+M$, such that a boost output similar to boost-type DC-DC.

Nevertheless, in this embodiment, the offset voltage control module is exemplarily described using a scenario where the eight stages of regulation branches are connected in parallel to MN2 in FIG. 3 as an example. In other practice of the present application, the offset voltage control module may also be connected to MN1 in parallel, or two offset voltage control modules may be arranged. Each offset voltage control module includes eight stages of regulation branches. The two 8 stages of regulation branches are respectively connected to MN1 and MN2 in parallel. The number of stages of regulation branches connected in parallel is not limited to 8, and the specific number of stages may be adaptively modified. For example, when 10 different voltage values need to be output with respect to the output voltage $V_{OUT}$ of the operational amplifier, nine stages of regulation branches may be arranged. The operational amplifier may also be modified. For example, the offset voltage control module in FIG. 5 may likewise be connected in parallel to MP5 in FIG. 4.

In other practice of the present disclosure, the differential input pair transistors and the transistors in the regulation branches may be adaptively replaced according to the actual needs. For example, the NMOS transistors may be replaced by PMOS transistors. The solutions upon such replacements shall also fall within the protection scope of the present disclosure, which are not described herein any further.

In addition, based on the above embodiments, the reference voltage irrelevant to the temperature coefficient in the voltage regulator is specifically generated by the bandgap reference generation circuit.

The bandgap reference generation circuit uses a sum of a voltage negatively proportional to the temperature and a voltage positively proportional to the temperature, such that the temperature coefficients of these two voltages are offset, such that a circuit of the reference voltage irrelevant to the temperature is obtained.

Figure 6:
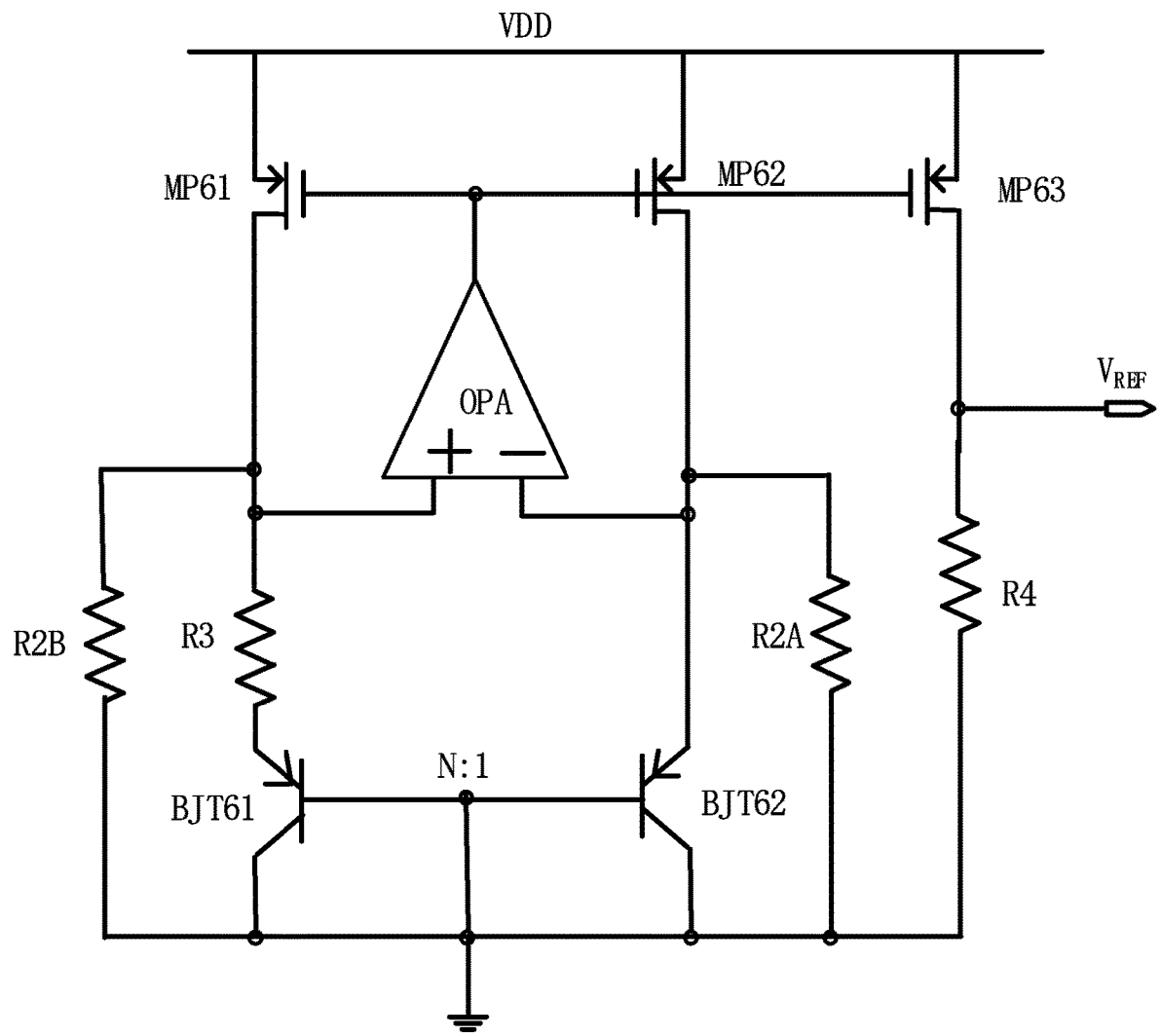
FIG. 6 is a schematic structural diagram of a conventional bandgap reference generation circuit according to an embodiment of the present disclosure.

FIG. 6 is a schematic structural diagram of a conventional bandgap reference generation circuit according to an embodiment of the present disclosure. As illustrated in FIG. 6, the bandgap reference generation circuit includes: an operational amplifier (OPA), PMOS transistors MP61, MP62 and MP63, BJT transistors BJT61 and BJT62, resistors R2A, R2B, R3 and R4, where R2A=R2B.

Drains of MP61, MP62 and MP63 are connected to the drive voltage VDD, gates thereof are connected to an output terminal of the OPA; the drain of MP61 is connected to a non-inverting input terminal of the OPA, connected to the ground via the resistor R2B and connected to an emitter of BJT61 via the resistor R3; the drain of MP62 is connected to an inverting input terminal of the OPA, connected to the ground via the resistor R2A and connected to an emitter of BJT62; a base of BJT61 is connected to a base of BJT62 and connected to the ground; a collector of BJT61 and a collector of BJT62 are connected to the ground; a ratio of the area of the emitter of BJT61 to the area of the emitter of BJT62 is N:1; the drain of MP63 is connected to the ground via the resistor R4, and the drain of MP63 is configured to output a single-fold bandgap reference voltage $V_{REF}$:

$$V_{REF} = \frac{R_4}{R_{2A}}\left[U_T \frac{R_{2A}}{R_3}\ln(N) + V_{EB61}\right] \quad (5)$$

$U_T$ is a thermal voltage, and $V_{EB61}$ is a voltage between a base B and the collector E of BJ61. A reference voltage irrelevant to the temperature may be obtained by regulating a ratio of the resistor R2A to the resistor R3. Regulating the ratio of the resistor R4 to the resistor R2A may change the value of $V_{REF}$.

In this embodiment, to further reduce power consumption, the bandgap reference generation circuit may be one of: a $\Delta V_{GS}$-based ($V_{GS}$ is a voltage between the gate and the source of a MOS transistor) bandgap reference generation circuit having a full CMOS reference offset structure, a proportional to absolute temperature (PTAT) unit-based and $V_{GS}$-based bandgap reference generation circuit having a full CMOS reference offset structure, and a PTAT unit-based and bipolar junction transistor (BJT)-based bandgap reference generation circuit having a complementary structure. These three circuits are all CMOS-based circuits, and therefore, has less power consumption and a small area.

For example, the PTAT unit-based and BJT-based bandgap reference generation circuit having a complementary structure specifically includes:

a BJT transistor, configured to generate a voltage having a positive temperature coefficient based on a voltage between a base and an emitter of the BJT transistor; and a MOS transistor-based PTAT unit, configured to generate a voltage having a negative temperature coefficient based on a MOS transistor operating in a subthreshold region;

where the emitter of the BJT transistor and the PTAT unit are connected to a drive voltage VDD via a current unit, such that the BJT transistor and the PTAT unit have a predefined offset current such that the voltage having the positive temperature coefficient and the voltage having the negative temperature coefficient are complementary to each other and the reference voltage irrelevant to the temperature coefficient is generated.

A single-fold bandgap reference voltage $V_{REF1}$ is typically 1.2 V. To obtain an n-fold bandgap reference voltage, in this embodiment, the PTAT unit-based and BJT-based bandgap reference generation circuit having a complementary structure includes n groups of PTAT units and n BJT transistors. The voltage having the positive temperature coefficient generated by each BJT transistor is complementary to the voltage having the negative temperature coefficient generated by each group of PTAT units, such that the generated reference voltage is the n-fold bandgap reference voltage.

Figure 7:
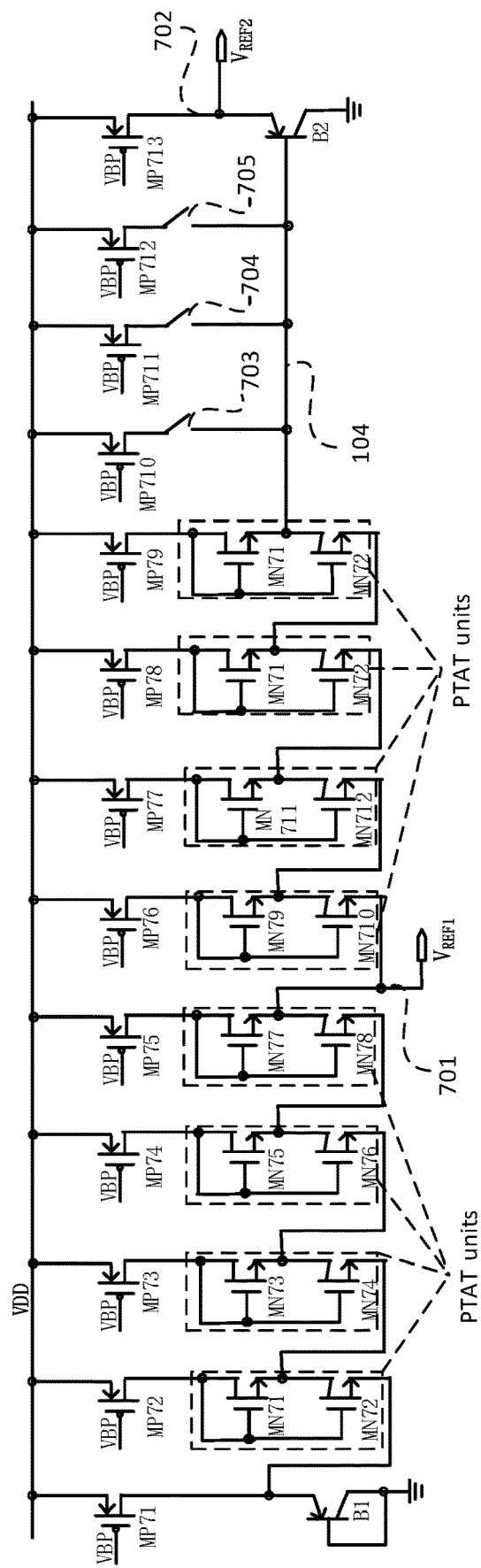
FIG. 7 is a schematic structural diagram of a PTAT unit-based and BJT-based bandgap reference generation circuit having a complementary structure according to an embodiment of the present disclosure.

Specifically, when n is equal to 2, a structure of the PTAT unit-based and BJT-based bandgap reference generation circuit having a complementary structure is as illustrated in FIG. 7. In FIG. 7, the current unit may be specifically a current mirror which includes:

BJT transistors B1 and B2; where an emitter of the BJT transistor B1 is connected to the drive voltage VDD via a current mirror, a base of the BJT transistor B1 is connected to a collector thereof, and the collector is connected to the ground; an emitter of the BJT transistor B2 is connected to the drive voltage VDD via the current mirror, and an collector of the BJT transistor B2 is connected to the ground, such that the voltage having the positive temperature coefficient is generated based on the voltage between the base and the emitter of the BJT transistor; and two groups of MOS transistor-based PTAT units, configured to generate a voltage having a negative temperature coefficient based on a MOS transistor operating in a sub-threshold region; where the PTAT units include two groups and totally eight stages, with four stages included in each group, and the two groups of PTAT units are arranged in series between the emitter of B1 and the base of B2;

where the emitter of the BJT transistor and the PTAT unit are connected to a drive voltage VDD via a current mirror, such that the BJT transistor and the PTAT unit have a predefined offset current such that the voltage having the positive temperature coefficient and the voltage having the negative temperature coefficient are complementary to each other and the reference voltage irrelevant to the temperature coefficient is generated.

A node between the two groups of PTAT units is a single-fold bandgap output node, configured to output a single-fold bandgap reference voltage, that is, a 1.2 V reference voltage $V_{REF1}$, the emitter of the second BJT transistor is a double-fold bandgap output node, configured to output a double-fold bandgap reference voltage $V_{REF2}$, that is, a 2.5 V reference voltage. In this way, the single-fold bandgap reference voltage and the double-fold bandgap reference voltage may be simultaneously obtained.

Figure 8:
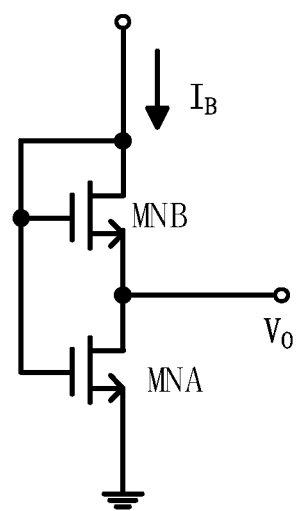
FIG. 8 is a schematic structural diagram of PTAT unit according to an embodiment of the present disclosure.

Specifically, as illustrated in FIG. 8, the PTAT unit includes two NMOS transistors MNA and MNB. A source of MNA is connected to the ground, a gate of MNA is connected to a gate of MNB and a drain of MNB, and the drain of MNB is connected to the drive voltage VDD via the current mirror. The current mirror may ensure that bias currents $I_B$ of various PTAT units are equal (that is, the above predefined bias current). The two NMOS transistors of the PTAT unit both operate in a subthreshold region. As known from a long channel static model, when drain and source voltages of the NMOS transistor are greater than 4-5 $U_T$, the NMOS transistor operates in a positive phase saturated region. Drain and source currents in the positive phase saturated region are as follows:

$$I_D = I_S \cdot e^{[-V_{T0}/nU_T]} \cdot e^{[V_G/nU_T]} \cdot [e^{(-V_S/U_T)} - e^{(-V_D/U_T)}] \quad (6)$$

$$I_S = 2*(W/L), U_T^2 I_S = 2 \cdot n \cdot (W/L) \cdot U_T^2 \quad (7)$$

$U_T$ is a thermal voltage of the NMOS transistor, $V_{T0}$ is an intrinsic threshold voltage of the NMOS transistor, and n is a weak-inversion slope factor.

In addition, the transistor MNB operates in the positive phase saturated region further satisfies $V_D - V_S \geq U_T$, and in this case, a voltage to ground $V_O$ at the drain of the transistor MNA is:

$$V_O = U_T \cdot \ln\left[1 + \frac{S_{TB}}{S_{TA}} \cdot \frac{I_{DTA}}{I_{DTB}}\right] \quad (8)$$

$S_{TA}$ is a dimension of the transistor MNA, $S_{TB}$ is a dimension of the transistor MNB, $I_{DTA}$ is a drain current of the transistor MNA, and $I_{DTB}$ is a drain current of the transistor MNB.

Input and output nodes of the PTAT unit are respectively nodes corresponding to the ground point and the drain of the transistor MNA in FIG. 8. When the PTAT units are connected in series to form a bandgap reference generation circuit, as illustrated in FIG. 7, a input node of the PTAT unit is connected to the output node of a previous stage of PTAT unit, and the output node of a PTAT unit is connected to the input node of a next stage of PTAT unit. The input node of the first stage of PTAT unit (that is, the PTAT unit on the leftmost side in FIG. 7) is connected to the emitter of B1. When a PTAT unit is the last stage of PTAT unit (that is, the PTAT unit on the rightmost side in FIG. 7), the output node is connected to the base of B2.

Specifically, for ease of calculation, herein it is assumed that parameters of B1 and B2 are totally the same, and parameters of all the PTAT units are also totally the same. Based on the above PTAT unit, current input terminals of a current mirror unit may be MP71, and MP72-MP79, and MP813 is a mirror unit whose gate is connected to a bias voltage VBP such that the mirror unit operates. In FIG. 7, MN71 and MN 72 are the first stage of PTAT units, MN73 and MN74 are the second stage of PTAT units, and analogously, MN715 and MN716 are the eighth stage of PTAT units. B1 and B2 are respectively connected to the drive voltage VDD via MP 71 and MP713. The eight stages of PTAT units are respectively connected to the drive voltage VDD via MP72-MP79. In this case, a single-fold bandgap output node 701 in FIG. 7 output a single-fold bandgap reference voltage $V_{REF1}$ as follows:

$$V_{REF1} = V_{BE} + \Sigma_{N=5}^{8} U_T \ln(1+\beta \cdot \alpha) \quad (9)$$

In FIG. 7, a double-fold bandgap output node 702 outputs a double-fold bandgap reference voltage $V_{REF2}$ as follows:

$$V_{REF2} = 2V_{BE} + \Sigma_{N=1}^{8} U_T \ln(1+\beta \cdot \alpha) \quad (10)$$

Figure 1:
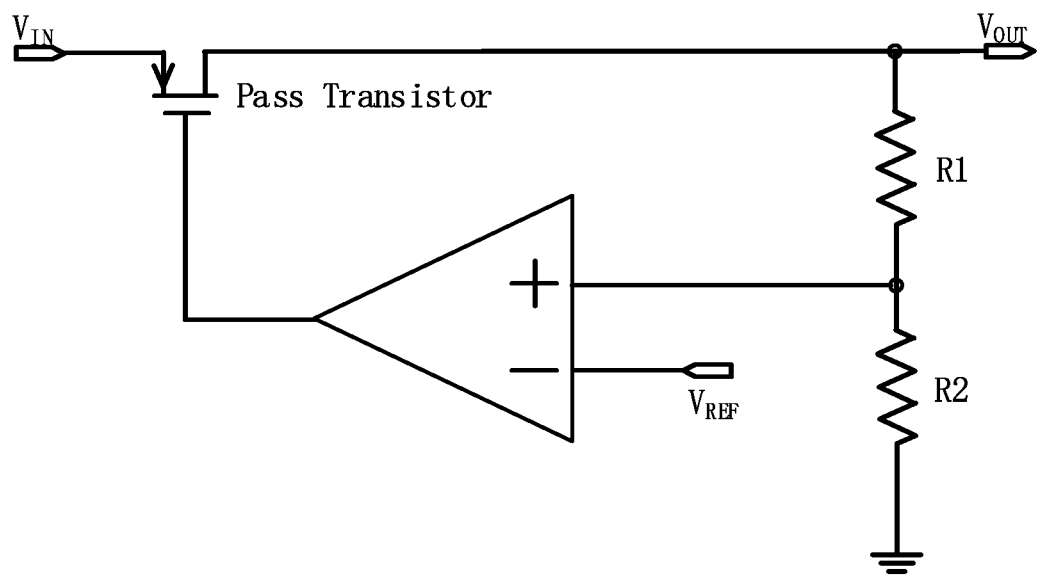
FIG. 1 is a schematic basic structural diagram of a voltage regulator in the related art.

In the above formulae, $\alpha = S_1/S_2 = S_3/S_4 = \ldots = S_{15}/S_{16}$, $S_1$-$S_{16}$ are respectively dimensions of the NMOS transistors MN71, MN72, MN73, MN74, MN75, MN76, MN77, MN78, MN79, MN710, MN711, MN712, MN713, MN714, MN715 and MN716 in the eight stages of PTAT units in FIG. 1, $\beta = I_{D1}/I_{D2} = I_{D3}/I_{D4} = \ldots = I_{D15}/I_{D16}$, $I_{D1}$-$I_{D16}$ are respectively the drain currents of the NMOS transistors MN71, MN72, MN73, MN74, MN75, MN76, MN77, MN78, MN79, MN710, MN711, MN712, MN713, MN714, MN715 and MN716 in the eight stages of PTAT units in FIG. 1, and $V_{BE}$ is a voltage between the bases B and the collectors E of B1 and B2, and N is the number of stages of the PTAT units.

Optionally, in this embodiment, the PTAT unit-based and BJT-based bandgap reference generation circuit having a complementary structure further includes a reference voltage control switch. One terminal of the reference voltage control switch is connected to the drive voltage VDD via a current unit, and the other terminal of the reference voltage control switch is connected to the PTAT unit, to control a current flowing through the PTAT unit based on conduction and non-conduction of the reference voltage control switch, and hence to control a value of the reference voltage and a temperature coefficient of the reference voltage.

As illustrated in FIG. 7, MP710, MP711 and MP712 are the same as MP72-MP79, and are all mirror units of the current mirror; one terminal of each of reference voltage control switches 703, 704 and 705 is connected to a node 106 (that is, the output node of the last stage of PTAT unit), and the other terminal of each of reference voltage control switches 703, 704 and 705 is connected to the drive voltage VDD respectively via MP710, MP711 and MP712 of the current mirror. By controlling conduction and non-conduction of the reference voltage control switches 703, 704 and 715, the current of the PTAT units may be increased, that is, $I_{DTA}$ in formula (7) may be increased, such that $V_O$ in formula (7) is increased. In this way, by controlling the value of $V_O$, the value of the reference voltage and the temperature coefficient of the reference voltage may be controlled.

The 1.2 V single-fold bandgap reference voltage and the 2.5 V double-fold bandgap reference voltage generated by the =PTAT unit-based and BJT-based bandgap reference generation circuit having a complementary structure, and the bias currents output by the single-fold bandgap output node 701 and the double-fold bandgap output node 702 are all small, such that the reference voltage $V_{REF}$ is only sufficient to be connected to a capacitive load, without a current load capability. However, in practice, the output reference voltage $V_{REF}$ does not need to be connected to the capacitive load, but needs to supply power for an analog circuit.

Hereinafter, increasing the current load capacity to the bandgap reference generation circuit is described using a specific application scenario. The bandgap reference generation circuit in FIG. 7 may generate a single-fold bandgap reference voltage $V_{REF1}$ of 1.2 V, and generate a double-fold bandgap reference voltage $V_{REF2}$ of 2.5 V. In practice, the single-fold bandgap reference voltage $V_{REF1}$ and the double-fold bandgap reference voltage $V_{REF2}$ all need to supply power for an electronic system in a standby state. The single-fold bandgap reference voltage $V_{REF1}$ may be used to supply power for a capacitive load of the electronic system, and thus the current load capability is not needed. The single-fold bandgap reference voltage $V_{REF2}$ may be used to supply power for an analogy circuit, and thus the current load capability is needed. However, the double-fold bandgap reference voltage $V_{REF2}$ output in FIG. 2 has a small bias current which is only 4 nA. If the electronic system extracts the bias current such that the circuit has the current load capability, the entire bandgap reference generation circuit may fail to operate. In this case, the double-fold bandgap reference voltage $V_{REF2}$ may be input to the buffer amplifier in FIG. 3, such that the current load capability is increased for the double-fold bandgap reference voltage $V_{REF2}$ to enable the double-fold bandgap reference voltage $V_{REF2}$ to supply power for the analog circuit. After the buffer amplifier in FIG. 3 is connected, the load current may be maximally 1 mA, and in the meantime, the value of the output voltage $V_{OUT}$ may be regulated by the offset voltage control module connected to the buffer amplifier. In addition, the buffer amplifier may also achieve an isolation effect. That is, the buffer amplifier may prevent signals in the connected analog circuit from causing interference to the bandgap reference generation circuit.

Nevertheless, in other application scenarios, the single-fold bandgap reference voltage $V_{REF1}$ may also be input to an operational amplifier, for example, the FVF in FIG. 4, such that the value of the output voltage $V_{OUT}$ is increased by the FVF and thus a high output voltage $V_{OUT}$ is obtained, and the value of the output voltage $V_{OUT}$ is regulated by the offset voltage control module connected to the FVF in FIG. 4.

Another embodiment of the present application further provides a power supply. The power supply includes the above described voltage regulator.

In this embodiment, sine each stage of regulation branch in the offset voltage control module in the voltage regulator is based on a transistor structure, as compared with the voltage dividing resistor in the related art, the transistor has lower power consumption, and thus power consumption of the power supply is lowered.

In addition, a person skilled in the art should understand the above division of units and modules is only an exemplary one, and if the apparatus is divided into other units or modules or not divided, the technical solution shall also fall within the protection scope of the present application as long as the information object has the above functions.

A person skilled in the art shall understand that the embodiments of the present application may be described to illustrate methods, apparatuses (devices), or computer program products. Therefore, hardware embodiments, software embodiments, or hardware-plus-software embodiments may be used to illustrate the present application. In addition, the present application may further employ a computer program product which may be implemented by at least one non-transitory computer-readable storage medium with an executable program code stored thereon. The non-transitory computer-readable storage medium comprises but not limited to a disk memory, a CD-ROM, and an optical memory.

Embodiments of the present disclosure are described based on the flowcharts and/or block diagrams of the method, apparatus (device), and computer program product. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams. These computer program instructions may also be stored a non-transitory computer-readable memory capable of causing a computer or other programmable data processing devices to work in a specific mode, such that the instructions stored on the non-transitory computer-readable memory implement a product comprising an instruction apparatus, where the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Although the preferred embodiments of the present application are described above, once knowing the basic creative concept, a person skilled in the art can make other modifications and variations to these embodiments. Therefore, the appended claims are intended to be construed as covering the preferred embodiments and all the modifications and variations falling within the scope of the present application. Obviously, a person skilled in the art can make various modifications and variations to the present application without departing from the spirit and scope of the present application. In this way, the present application is intended to cover the modifications and variations if they fall within the scope of the appended claims of the present application and equivalent technologies thereof.

What is claimed is:

1. A voltage regulator, comprising:
an operational amplifier including an input terminal and an output terminal, and the operational amplifier is configured to generate an output voltage to be output from the output terminal based on a reference voltage received from the input terminal; and
an offset voltage control module including one stage of regulation branch or more stages of regulation branches connected in parallel, and the offset voltage control module is configured to control an offset voltage of the operational amplifier based on selection of the regulation branch to regulate the output voltage,
wherein the one stage of regulation branch or each of the more stages of regulation branches comprises a regulation element and a regulation switch, and the regulation branch is connected to a device affecting the offset voltage inside the operational amplifier; wherein conduction of the regulation branch is controlled by controlling conduction of the regulation switch, such that the regulation element of the conducted regulation branch is connected to the operational amplifier to control the offset voltage of the operational amplifier.

2. The voltage regulator according to claim 1, wherein the regulation element is a MOS transistor.

3. The voltage regulator according to claim 2, wherein when the offset voltage control module comprises more stages of regulation branches, width-to-length ratios of MOS transistors of different regulation branches are defined based on a predetermined rule to control a variation trend of the offset voltage.

4. The voltage regulator according to claim 3, wherein the width-to-length ratios of the MOS transistors of the different regulation branches are defined in an ascending order based on a predetermined step to control the offset voltage to be subject to a linear variation.

5. The voltage regulator according to claim 1, wherein when the regulation switches in all stages of regulation branches in the offset voltage control module are all turned off, the offset voltage is 0 V.

6. The voltage regulator according to claim 1, wherein the operational amplifier comprises a differential input pair transistors; wherein at least one of the differential input pair transistors is connected in parallel to any one or more stages of regulation branches in the offset voltage control module to control a voltage difference between the differential input pair transistors by the any one or more stages of regulation branches in the offset voltage control module, and hence to control the offset voltage of the operational amplifier.

7. The voltage regulator according to claim 1, further comprising a bandgap reference generation circuit, configured to generate a reference voltage irrelevant to a temperature coefficient.

8. The voltage regulator according to claim 7, wherein the bandgap reference generation circuit comprises at least one of: a $\Delta V_{GS}$-based bandgap reference generation circuit having a full CMOS reference offset structure, a PTAT unit-based and $V_{GS}$-based bandgap reference generation circuit having a full CMOS reference offset structure, and a PTAT unit-based and BJT-based bandgap reference generation circuit having a complementary structure.

9. The voltage regulator according to claim 8, wherein the PTAT unit-based and BJT-based bandgap reference generation circuit having a complementary structure comprises:
a BJT transistor, configured to generate a voltage having a positive temperature coefficient based on a voltage between a base and an emitter of the BJT transistor; and
a MOS transistor-based PTAT unit, configured to generate a voltage having a negative temperature coefficient based on a MOS transistor operating in a subthreshold region;
wherein the emitter of the BJT transistor and the PTAT unit are connected to a drive voltage via a current unit, such that the BJT transistor and the PTAT unit have a predefined offset current such that the voltage having the positive temperature coefficient and the voltage having the negative temperature coefficient are complementary to each other and the reference voltage irrelevant to the temperature coefficient is generated.

10. The voltage regulator according to claim 9, wherein the PTAT unit-based and BJT-based bandgap reference generation circuit having a complementary structure comprises: n groups of PTAT units and n BJT transistors, wherein the voltage having the positive temperature coefficient generated by each BJT transistor is complementary to the voltage having the negative temperature coefficient generated by each group of PTAT units, such that the generated reference voltage is an n-fold bandgap reference voltage.

11. The voltage regulator according to claim 10, wherein when n is equal to 2, the PTAT unit-based and BJT-based bandgap reference generation circuit having a complementary structure comprises: BJT transistors B1 and B2; wherein an emitter of the BJT transistor B1 is connected to the drive voltage via a current mirror, a base of the BJT transistor B1 is connected to a collector thereof, and the collector is connected to the ground; an emitter of the BJT transistor B2 is connected to the drive voltage via the current mirror, and an collector of the BJT transistor B2 is connected to the ground, such that the voltage having the positive temperature coefficient is generated based on the voltage between the base and the emitter of the BJT transistor; and
two groups of MOS transistor-based PTAT units; wherein the two groups of PTAT units are arranged in series between the emitter of the BJT transistor B1 and the base of the BJT transistor B2, a node between the two groups of PTAT units is a single-fold bandgap output node configured to output a single-fold bandgap reference voltage, and the emitter of the BJT transistor B2 is a double-fold bandgap output node configured to output a double bandgap reference voltage.

12. The voltage regulator according to claim 9, wherein the bandgap reference generation circuit further comprises a reference voltage control switch; wherein one terminal of the reference voltage control switch is connected to the drive voltage via the current unit, and the other terminal of the reference voltage control switch is connected to the PTAT unit to control a current flowing through the PTAT unit based on conduction and non-conduction of the reference voltage control switch, and hence to control a value of the reference voltage and a temperature coefficient of the reference voltage.

13. The voltage regulator according to claim 9, wherein the current unit is a current mirror.

14. The voltage regulator according to claim 1, further comprising a control switch, configured to be connected to the output terminal of the operational amplifier and an electronic system, wherein the control switch is turned on when the control switch is in standby such that the output voltage of the operational amplifier supplies power for a part of modules in the standby electronic system.

15. The voltage regulator according to claim 1, wherein the operational amplifier comprises a buffer amplifier.

16. A power supply, comprising a voltage regulator, wherein the voltage regulator comprises:
- an operational amplifier including an input terminal and an output terminal, and the operational amplifier is configured to generate an output voltage to be output from the output terminal based on a reference voltage received from the input terminal; and
- an offset voltage control module including one stage of regulation branch or more stages of regulation branches connected in parallel, and the offset voltage control module is configured to control an offset voltage of the operational amplifier based on selection of the regulation branch to regulate the output voltage,
- wherein the one stage of regulation branch or each of the more stages of regulation branches comprises a regulation element and a regulation switch, and the regulation branch is connected to a device affecting the offset voltage inside the operational amplifier; wherein conduction of the regulation branch is controlled by controlling conduction of the regulation switch, such that the regulation element of the conducted regulation branch is connected to the operational amplifier to control the offset voltage of the operational amplifier.

17. A voltage regulator, comprising:
- an operational amplifier including an input terminal and an output terminal, and the operational amplifier is configured to generate an output voltage to be output from the output terminal based on a reference voltage received from the input terminal; and
- an offset voltage control module including one stage of regulation branch or more stages of regulation branches connected in parallel, and the offset voltage control module is configured to control an offset voltage of the operational amplifier based on selection of the regulation branch to regulate the output voltage,
- wherein the operational amplifier comprises a differential input pair transistors; wherein at least one of the differential input pair transistors is connected in parallel to any one or more stages of regulation branches in the offset voltage control module to control a voltage difference between the differential input pair transistors by the any one or more stages of regulation branches in the offset voltage control module, and hence to control the offset voltage of the operational amplifier.

* * * * *